(12) United States Patent
Asai et al.

(10) Patent No.: US 7,682,544 B2
(45) Date of Patent: Mar. 23, 2010

(54) METHOD OF FABRICATING PHOTOVOLTAIC PANEL

(75) Inventors: Koichi Asai, Nagoya (JP); Kazutoshi Sakai, Nagoya (JP); Hironobu Ichikawa, Nagoya (JP); Mitsuo Morishita, Toyota (JP); Shunji Yoshikane, Aichi (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 1304 days.

(21) Appl. No.: 11/166,350

(22) Filed: Jun. 27, 2005

(65) Prior Publication Data

US 2006/0000503 A1  Jan. 5, 2006

(30) Foreign Application Priority Data

Jun. 29, 2004  (JP) .............................. 2004-190590

(51) Int. Cl.
  *B29C 45/14* (2006.01)
(52) U.S. Cl. .............. 264/272.14; 264/1.7; 264/272.11; 264/272.15; 264/272.17
(58) Field of Classification Search ............ 264/272.11, 264/272.14, 272.15, 272.17, 1.7
  See application file for complete search history.

(56) References Cited

U.S. PATENT DOCUMENTS 5,008,062 A * 4/1991 Anderson et al. ...... 264/272.15

6,294,822 B1   9/2001 Nakata
6,399,412 B1 * 6/2002 Asai et al. ..................... 438/63
2004/0016456 A1 * 1/2004 Murozono et al. .......... 136/250

FOREIGN PATENT DOCUMENTS

| JP | 7-054855 B2 | 6/1995 |
| JP | 2002-060943 A | 2/2002 |
| JP | 2002-164554 A | 6/2002 |
| WO | WO99/10935 A1 | 3/1999 |

* cited by examiner

*Primary Examiner*—Philip C Tucker
*Assistant Examiner*—Amjad Abraham
(74) *Attorney, Agent, or Firm*—Foley & Lardner LLP

(57) ABSTRACT

A method of fabricating a photovoltaic panel is disclosed which is formed by arranging a number of granular photovoltaic devices in an array and forming the array into the shape of a panel from a transparent resin and includes each photovoltaic device having a part protruding from the resin. The method includes filling an escape recess of a receiver with a plastic sealing material, setting a forming die on the receiver, accommodating the photovoltaic devices in bowl-shaped recesses of the forming die respectively, pressing the photovoltaic devices accommodated in the bow-shaped recesses from above so that lower portions of the photovoltaic devices are fitted into the through holes of the bowl-shaped recesses thereby to be thrust inside the plastic sealing material substantially by a predetermined amount, respectively, pouring a liquid phase of the transparent resin into the forming cavity of the forming die, hardening the liquid resin in the forming cavity of the forming die so that the photovoltaic devices are integrated by the transparent resin into a photovoltaic panel, and taking the photovoltaic panel out of the forming cavity of the forming die.

4 Claims, 11 Drawing Sheets ical photovoltaic devices in order to improve a generating
METHOD OF FABRICATING PHOTOVOLTAIC PANEL This application claims priority from Japanese Patent Application 2004-190590, filed Jun. 29, 2004, which is incorporated herein by reference in its entirety.

BACKGROUND OF THE INVENTION

1. Field of the Invention

This invention relates to a method of fabricating a photovoltaic panel by arranging a number of granular photovoltaic devices in an array and forming the array into the shape of a panel from a transparent resin.

2. Description of the Related Art

JP-B-H07-54855 and JP-A-2002-164554 disclose spherical photovoltaic devices in order to improve a generating efficiency of a photovoltaic panel which converts solar energy into electric energy, for example. The spherical photovoltaic device provides a substantially constant project area (an amount of received light) when viewed from every direction of incidence of sunlight. Accordingly, even when the sun altitude is low, power generation can advantageously be performed as efficiently as when the sun altitude is high.

In the above-noted techniques, spherical silicon is fitted in a number of circular holes formed in a base plate. Surface electrodes are formed on exposed portions of projecting spherical silicon at the underside of the base plate with an insulating layer being interposed therebetween.

In the above-described conventional technique, however, the spherical silicon exposed at the upper side of the base plate has a light-receiving region whose area depends upon a relation between an inner diameter of each circular hole formed in the base plate and an outer diameter of the spherical silicon. An electrode-forming region at the underside of the base plate has a size (or height) also depending upon the aforesaid relation between the inner diameter of each circular hole formed in the base plate and the outer diameter of the spherical silicon. Accordingly, in order that the area of the light-receiving region and the size of the electrode-forming region may be uniformed, an outer diameter, shape and circularity of the spherical silicon necessitate a high uniformity. As a result, management or control is complicated in the spherical silicon manufacturing process, thereby reducing the productivity of spherical silicon. Furthermore, the yield of the spherical silicon is reduced, which increases the production cost.

SUMMARY OF THE INVENTION

Therefore, an object of the present invention is to provide a method of fabricating a photovoltaic panel which can meet a required quality level of the photovoltaic panel, expand allowable ranges of the outer diameter, shape and circularity of the photovoltaic device (granular silicon), and improve the production efficiency and yield without reduction in the production quality.

In one aspect, the present invention provides a method of fabricating a photovoltaic panel which is formed by arranging a number of granular photovoltaic devices in an array and forming the array into the shape of a panel from a transparent resin and includes each photovoltaic device having a part protruding from the resin. The method employs a forming die having a forming cavity in which a number of bowl-shaped recesses are formed so that the photovoltaic devices are accommodated in the recesses respectively. Each bowl-shaped recess has a bottom formed with a circular through hole through which the part of each photovoltaic device protrudes downward. The method further employs a receiver including a part which is opposed at least to the through hole and is formed with an escape recess. The method comprises filling the escape recess of the receiver with a plastic sealing material, setting the forming die on the receiver, accommodating the photovoltaic devices in the bowl-shaped recesses of the forming die respectively, pressing the photovoltaic devices accommodated in the bow-shaped recesses from above so that lower portions of the photovoltaic devices are fitted into the through holes of the bowl-shaped recesses thereby to be thrust inside the plastic sealing material substantially by a predetermined amount, respectively, pouring a liquid phase of the transparent resin into the forming cavity of the forming die, hardening the liquid resin in the forming cavity of the forming die so that the photovoltaic devices are integrated by the transparent resin into a photovoltaic panel, and taking the photovoltaic panel out of the forming cavity of the forming die.

In the above-described method, the escape recess of the receiver is filled with the plastic sealing material, and the forming die is set on the receiver. The photovoltaic devices accommodated in the respective bowl-shaped recesses of the forming die are pressed from above so that the lower portions of the photovoltaic devices are fitted into the through holes of the bowl-shaped recesses thereby to be thrust inside the plastic sealing material substantially by a predetermined amount, respectively. Thereafter, the liquid phase of the transparent resin is poured into the forming cavity of the forming die, and the liquid resin is hardened in the forming cavity of the forming die so that the photovoltaic devices are integrated by the transparent resin into the photovoltaic panel. Consequently, even when the outer diameter, shape and circularity of the photovoltaic devices used in the fabrication of photovoltaic panels vary to some extent, an amount of protrusion of each device from the resin of the photovoltaic panel can be uniformed and the plastic sealing material can seal a gap between the through hole of each bowl-shaped recess and the photovoltaic device, which gap results from the variations in the outer diameter, shape and circularity of the photovoltaic devices, whereupon the resin can be prevented from leaking through the gap. In this case, the viscosity of the resin may be adjusted so that the leak may be prevented more reliably. Thus, allowable ranges of the outer diameter, shape and circularity of the photovoltaic devices can be expanded while the required quality level of the photovoltaic can be met. Furthermore, the production efficiency and yield can be improved without reduction in the production quality.

In another form, in the device thrusting process, the lower end of each photovoltaic device is thrust so as to be adjacent to the bottom of the escape recess of the receiver, whereby the lower portion of each photovoltaic device is thrust inside the plastic sealing material substantially by a constant amount. Consequently, an amount of protrusion of each device from the resin of the photovoltaic panel can be uniformed by a simple work, whereupon the production efficiency can further be improved. In the present invention, however, the viscosity of the plastic sealing material may be adjusted so that the lower portion of each photovoltaic device is thrust inside the plastic sealing material substantially by a predetermined amount, respectively.

In further another form, each photovoltaic device has an outer periphery and each through hole has an inner peripheral edge, and each through hole has a diameter set so that the outer periphery of each photovoltaic device is adjacent to the inner peripheral edge of the through hole while the lower end of each photovoltaic device is adjacent to the bottom of the escape recess of the receiver. Consequently, the gap between the through hole and the photovoltaic device in each bowl-shaped recess can be rendered smaller, and part of the plastic sealing material can be prevented from being forced into the bowl-shaped recess, whereupon the boundary between the photovoltaic device and the resin portion can be rendered smooth. As a result, in a process of forming an electrode, which also serves as a light reflection surface, an electrode (light reflecting surface) around the boundary between each photovoltaic device and resin section can smoothly be formed on the underside of the photovoltaic panel in electrode forming process, whereupon an amount of reflected light received by each photovoltaic device can be increased and accordingly, a photovoltaic efficiency can be improved.

In further another form, an electrode is formed on the part of each photovoltaic device protruding from the resin. Consequently, since an amount of protrusion of each photovoltaic device from the resin of the photovoltaic panel is uniformed, the size and height of the electrodes formed on the protruding portions can be uniformed.

Although the escape recess of the receiver is filled with the plastic sealing material in the above-described aspect, the forming die is set on the receiver which has not been filled with the plastic sealing material in another aspect. The photovoltaic devices are accommodated in the bowl-shaped recesses of the forming die respectively, and a lower part of each photovoltaic device is fitted into the through hole of each bowl-shaped recess so that a lower end of each photovoltaic device is adjacent to the bottom of each escape recess of the receiver. Subsequently, a liquid phase of the transparent resin poured into the forming cavity of the forming die and hardened to be formed into the photovoltaic panel. Consequently, even when the outer diameter, shape and circularity of the photovoltaic devices used in the fabrication of photovoltaic panels vary to some extent, an amount of protrusion of each device from the resin of the photovoltaic panel can be uniformed by a simple work, and the size and height of the electrodes formed on the protruding portions can be uniformed. Moreover, allowable ranges of the outer diameter, shape and circularity of the photovoltaic devices can be expanded while the required quality level of the photovoltaic can be met. Furthermore, the production efficiency and yield can be improved without reduction in the production quality.

In this case, too, each photovoltaic device has an outer periphery and each through hole has an inner peripheral edge, and each through hole has a diameter set so that the outer periphery of each photovoltaic device is adjacent to the inner peripheral edge of the through hole while the lower end of each photovoltaic device is adjacent to the bottom of the escape recess of the receiver. Consequently, the gap between the through hole and the photovoltaic device in each bowl-shaped recess can be rendered smaller when the liquid resin is poured into the forming cavity of the forming die. Accordingly, liquid resin can be prevented from leaking through the gap.

Furthermore, an electrode is formed on the part of each photovoltaic device protruding from the resin in this case, too. Consequently, since an amount of protrusion of each photovoltaic device from the resin of the photovoltaic panel is uniformed, the size and height of the electrodes formed on the protruding portions can be uniformed.

In the foregoing aspects, the forming die is used to form the resin portion of the photovoltaic panel. In a third aspect, the forming cavity is formed in the plastic sealing material filling the recess of the receiver. The forming cavity thus formed is used as the forming die. More specifically, recesses formed in an upper side of the receiver are filled with a plastic sealing material. A transfer die is pressed against the plastic sealing material. The transfer die is provided for transferring a shape of a forming cavity for forming a resin section of the photovoltaic panel. As a result, a forming cavity is formed in the plastic sealing material. The forming cavity has a number of bowl-shaped recesses in which a number of photovoltaic devices are to be accommodated respectively. The photovoltaic devices are accommodated in the bowl-shaped recesses of the forming cavity respectively. Subsequently, the photovoltaic devices accommodated in the bow-shaped recesses are pressed from above so that lower portions of the photovoltaic devices are thrust inside the plastic sealing material substantially by a predetermined amount, respectively. Thereafter, a liquid phase of a transparent resin is poured into the forming cavity and hardened. In this case, too, even when the outer diameter, shape and circularity of the photovoltaic devices used in the fabrication of photovoltaic panels vary to some extent, an amount of protrusion of each device from the resin of the photovoltaic panel can be uniformed, and the boundary between the photovoltaic device and the resin portion can be formed smoothly.

In this case, too, in the device thrusting process, the lower end of each photovoltaic device is thrust so as to be adjacent to the bottom of the recess of the receiver, whereby the lower portion of each photovoltaic device is thrust inside the plastic sealing material substantially by a constant amount. Consequently, an amount of protrusion of each device from the resin of the photovoltaic panel can be uniformed by a simple work, whereupon the production efficiency can further be improved.

Furthermore, an electrode is formed on the part of each photovoltaic device protruding from the resin in this case, too. Consequently, since an amount of protrusion of each photovoltaic device from the resin of the photovoltaic panel is uniformed, the size and height of the electrodes formed on the protruding portions can be uniformed.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 13:
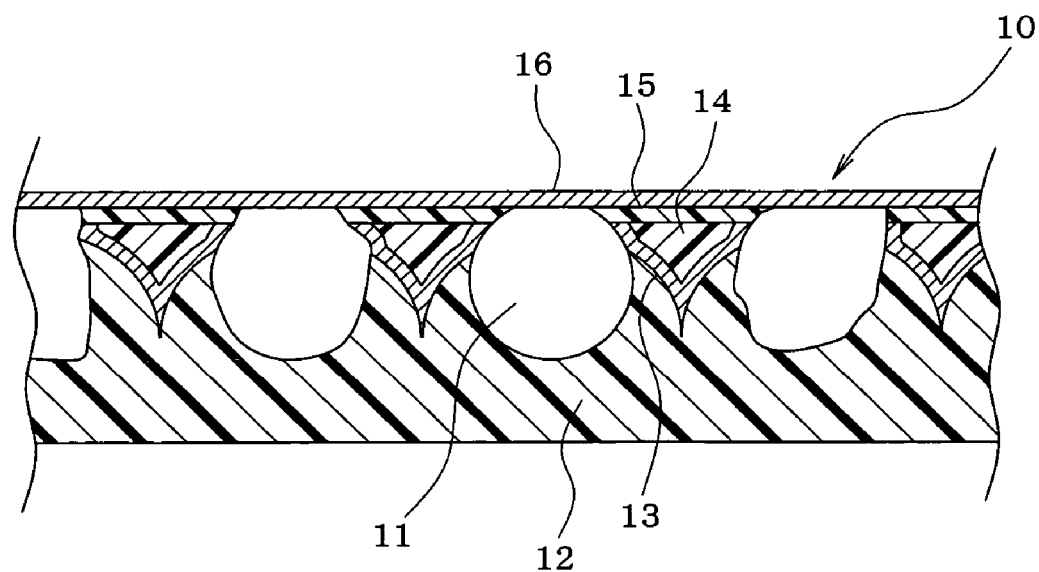
FIG. 13 shows a process of forming a p-type electrode in the fabricating method.
Figure 14:
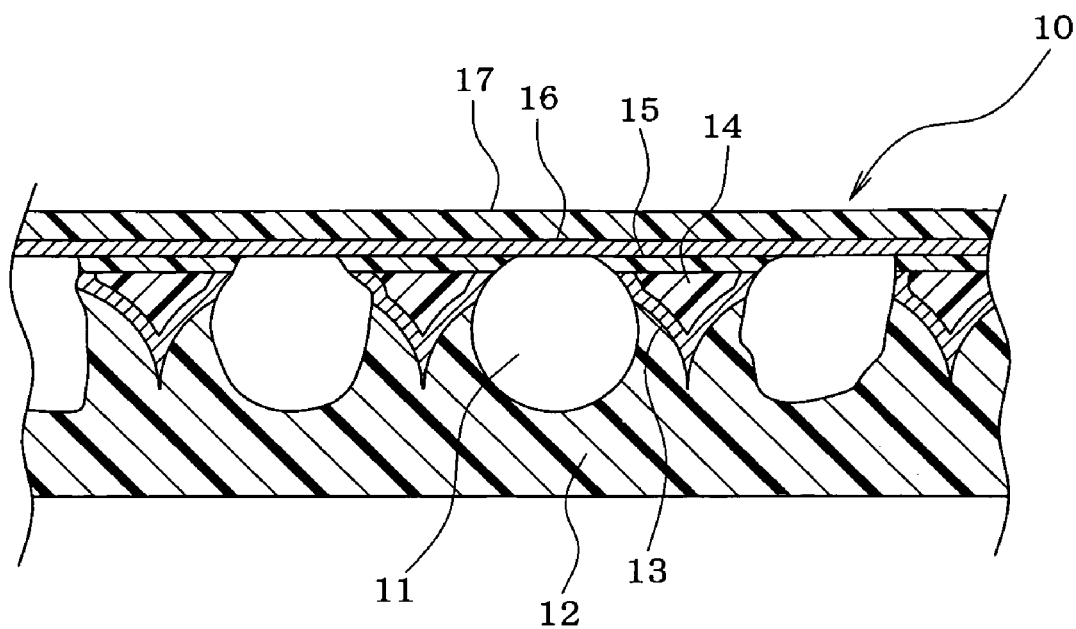
FIG. 14 shows a process of forming a protective insulating layer in the fabricating method.

A first embodiment of the present invention will be described with reference to FIGS. 1 to 14. Referring first to FIG. 14, the structure of a photovoltaic panel 10 manufactured by the method in accordance with the embodiment of the invention will be described. The photovoltaic panel 10 comprises a number of granular photovoltaic devices 11 arranged into a staggered shape or a matrix and integrated by a transparent resin 12 (resin section). A light-transmissible ultraviolet (UV) curable resin is used as the transparent resin 12, for example.

Each photovoltaic device 11 includes a thin n-type semiconductor layer in the outer periphery thereof and a p-type semiconductor layer in the inner peripheral side. A method of manufacturing the photovoltaic device 11 should not be limited to a particular one and the free fall method described in international publication No. WO99/10935, the plasma-assisted CVD method described in JP-A-2002-60943 or another method may be employed.

A negative electrode 13 causing an outer peripheral n-type semiconductor layer of each photovoltaic device 11 to conduct is formed on the backside of the photovoltaic panel (upper side in FIG. 14) so as to cover the backside of the transparent resin 12. The negative electrode 13 is completely covered with two insulating resin layers 14 and 15. The lower insulating resin layer 14 serves as a protecting layer (mask) in etching as will be described later, whereas the upper insulating resin layer 15 serves as an insulating layer insulating the negative electrode 13 and positive electrode 16.

The n-type semiconductor layer is partially removed by abrasion etc. such that a portion at which the p-type semiconductor layer is exposed is formed in a rear end of each photovoltaic device 11. A positive electrode 16 is formed so as to cause the p-type semiconductor layer to conduct. The positive electrode 16 is completely covered with a protective insulating layer 17 made from an insulating resin etc., thereby being protected and insulated.

A method of manufacturing the photovoltaic panel 10 constructed above will be described. As described above, the method of manufacturing the granular photovoltaic device 11 is not limited to a particular method and any method may be used to make the spherical or granular photovoltaic device 11. One manufacturer may continuously carry out all the processes from manufacture of the photovoltaic devices 11 to manufacture of the photovoltaic panel 10, or one manufacturer may purchase photovoltaic devices 11 manufactured by another manufacturer and manufacture the photovoltaic panels 10. The following describes sequential processes for manufacturing the photovoltaic panels 10 using the spherical or granular photovoltaic devices 11 manufactured by any method with reference to FIGS. 1 to 14.

Figure 1:
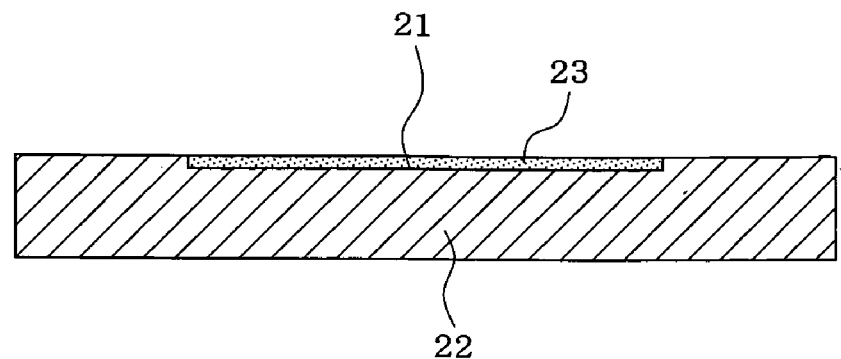
FIG. 1 shows a process of filling an escape recess with a plastic sealing material in the method of fabricating a photovoltaic panel of a first embodiment.

1. Process of Filling Escape Recess with Plastic Sealing Material:

Firstly, as shown in FIG. 1, a receiver 22 having a shallow escape recess 21 formed in an upper side thereof is prepared. The escape recess 21 is filled with a plastic sealing material 23. The plastic sealing material 23 is plastically deformable and has such a sealability that prevents a liquid resin of the transparent resin 12 (UV curable resin) from penetration. Furthermore, the plastic sealing material 23 is s material to which the transparent resin 12 does not adhere. More specifically, the plastic sealing material 23 may be made from oil clay, paste, urethane sealing material for tile joint, thermosetting liquid silicon rubber for separating dies and the like.

The escape recess 21 of the receiver 22 has a depth set to be equal to or larger than an amount of protrusion of each photovoltaic device 11 from the transparent resin 12 of the photovoltaic panel 10.

Figure 2:
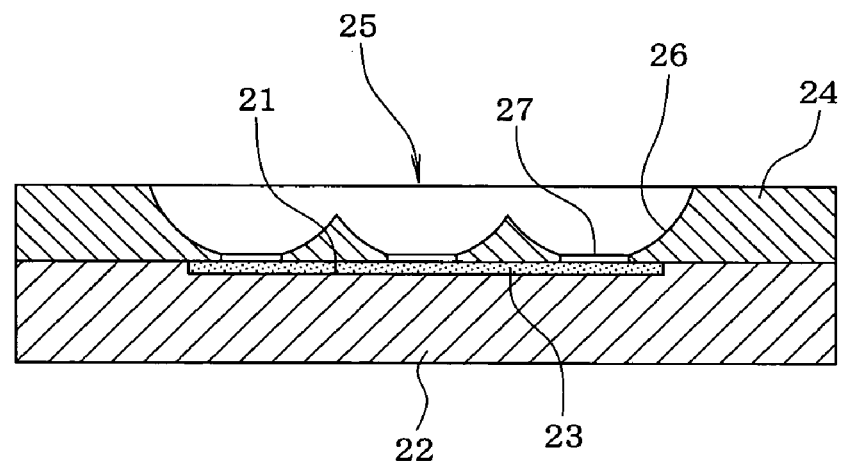
FIG. 2 shows a process of setting a forming die in the fabricating method.

2. Process of Setting a Forming Die:

After completion of the filling process, the fabrication sequence advances to a process of setting a forming die. The forming die 24 is set as shown in FIG. 2. The forming die 24 has a forming cavity 25 formed with a number of bowl-shaped recess 26 in which the photovoltaic devices 11 are accommodated respectively. Each bowl-shaped recess 26 has a circular through hole 27 formed in a bottom thereof so that a part of each photovoltaic device 11 protrudes downward from the through hole. Only three of the bowl-shaped recesses 26 are shown in FIGS. 2 to 6.

Figure 3:
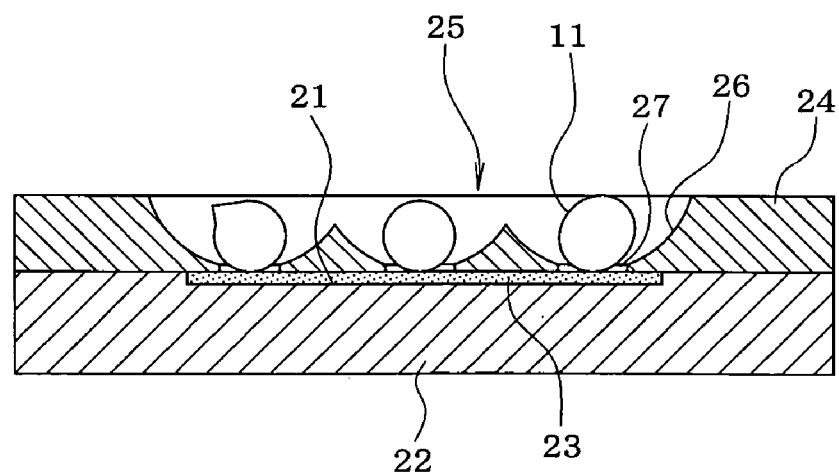
FIG. 3 shows a process of accommodating photovoltaic elements in the fabricating method.

3. Process of Accommodating Photovoltaic Devices:

After completion of the setting process, the fabrication sequence advances to a process of accommodating photovoltaic devices. As shown in FIG. 3, the photovoltaic devices 11 are accommodated in the bowl-shaped recesses 26 respectively. The forming die 24 maybe set on the receiver 22 after the photovoltaic devices 11 are accommodated in the bowl-shaped recesses 26 respectively.

Figure 4:
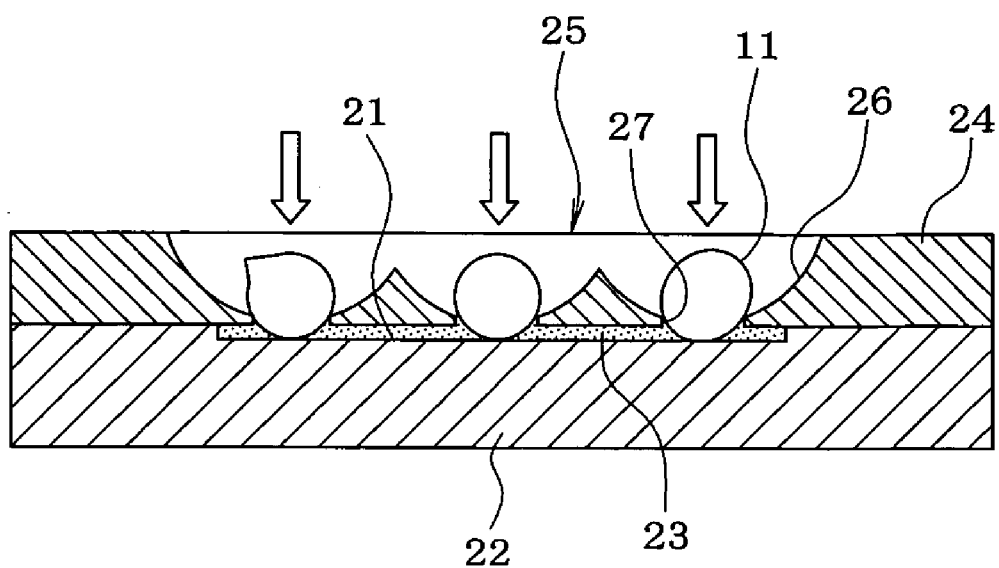
FIG. 4 shows a process of thrusting devices in the fabricating method.

4. Process of Thrusting Devices:

The fabrication sequence advances to a device thrusting process after completion of the accommodating step. As shown in FIG. 4, the photovoltaic devices 11 accommodated in the bowl-shaped recesses 26 of the forming die 24 are pressed from above by jigs (not shown) so that lower parts of the photovoltaic devices 11 are fitted into the through holes 27, respectively. Thus, each photovoltaic device 11 is thrust into the plastic sealing material 23 in the escape recess 21 substantially by a predetermined amount. In the device thrusting process, the lower end of each photovoltaic device 11 is thrust into so as to be adjacent to the bottom of the escape recess 21 of the receiver 22, whereby the lower portion of each photovoltaic device 11 is thrust into the plastic sealing material 23 substantially by a constant amount.

In this case, when the lower end of each photovoltaic device 11 is adjacent to the bottom of the escape recess 21 of the receiver 22, a diameter of each through hole 27 is set so that an outer peripheral face of each photovoltaic device 11 is adjacent to an inner peripheral edge of the through hole 27.

Figure 5:
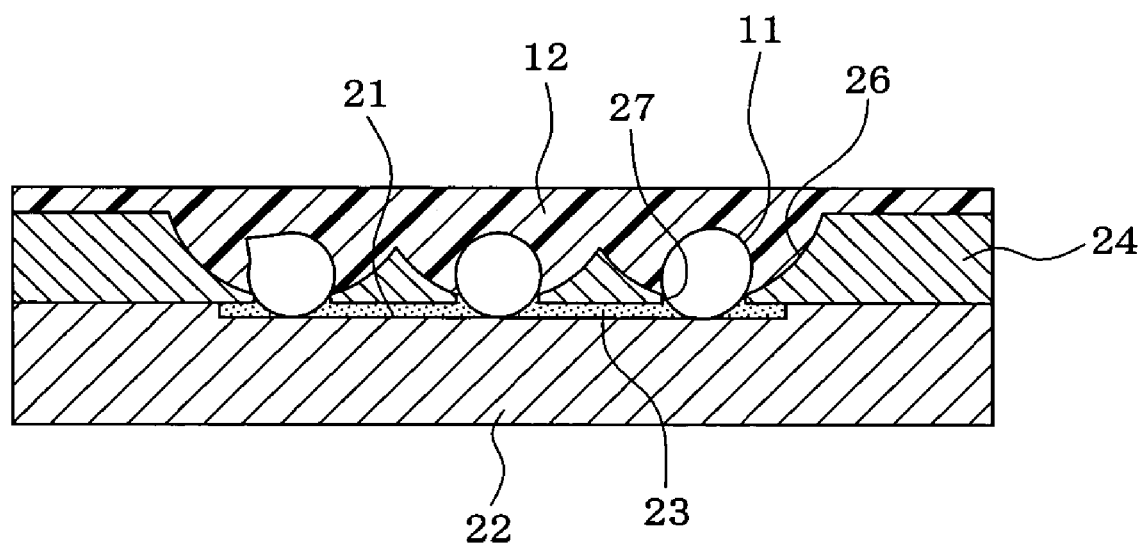
FIG. 5 shows a process of pouring a liquid resin in the fabricating method.

5. Process of Pouring Liquid-resin:

The fabrication sequence advances to a liquid-resin pouring process after completion of the device thrusting step. As shown in FIG. 5, a liquid resin (UV curable resin) of transparent resin 12 is poured into the forming cavity 25 of the forming die 24 so that all the bowl-shaped recesses 26 are completely filled with the liquid resin. In this case, the plastic sealing material 23 seals a gap between the through hole 27 of each recess 26 and the corresponding photovoltaic device 11, thereby preventing the resin from leaking through the gap.

Figure 6:
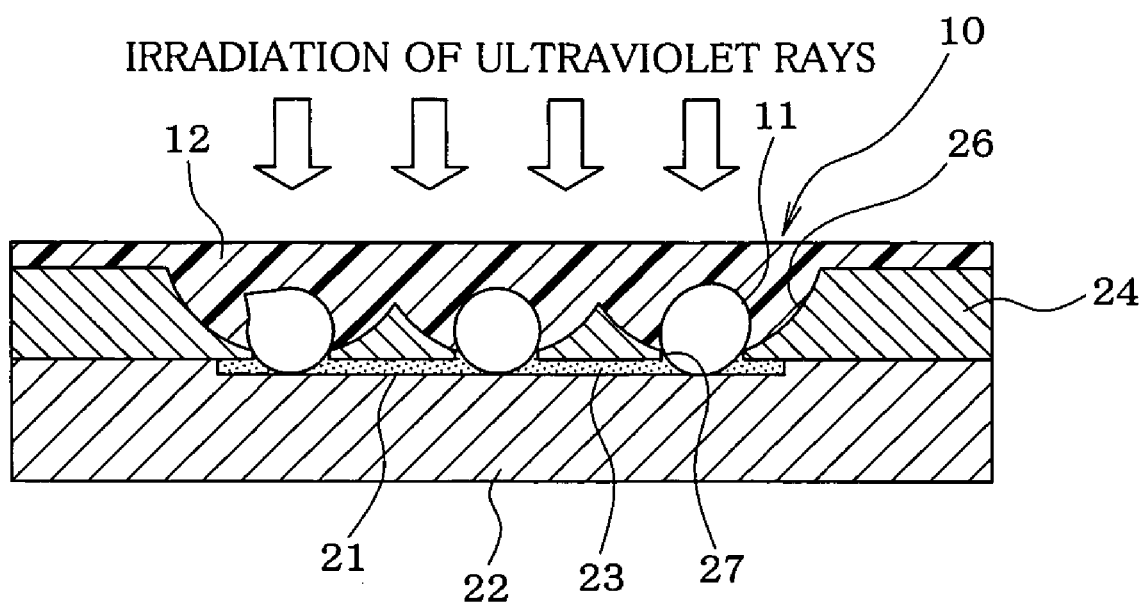
FIG. 6 shows a process of hardening the resin in the fabricating method.

6. Resin Hardening Process:

The fabrication sequence advances to a resin hardening process after completion of the liquid-resin pouring process. As shown in FIG. 6, ultraviolet rays are irradiated onto the liquid resin of the transparent resin 12 (UV curable resin) in the forming cavity 25 of the forming die 24 thereby to harden the liquid resin, whereby the photovoltaic devices 11 are integrated by the transparent resin 12 into the shape of a panel. Thus, the photovoltaic panel 10 is formed.

Figure 7:
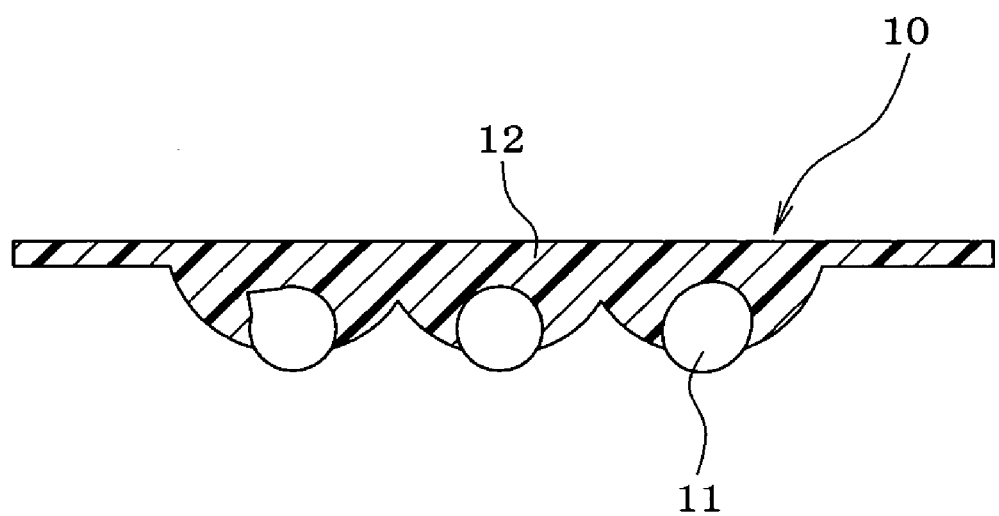
FIG. 7 shows a parting process in the fabricating method.

7. Parting Process:

The fabrication sequence advances to a parting process after completion of the resin hardening process. As shown in FIG. 7, the photovoltaic panel 10 is taken out of the forming cavity 25 of the forming die 24.

Figure 8:
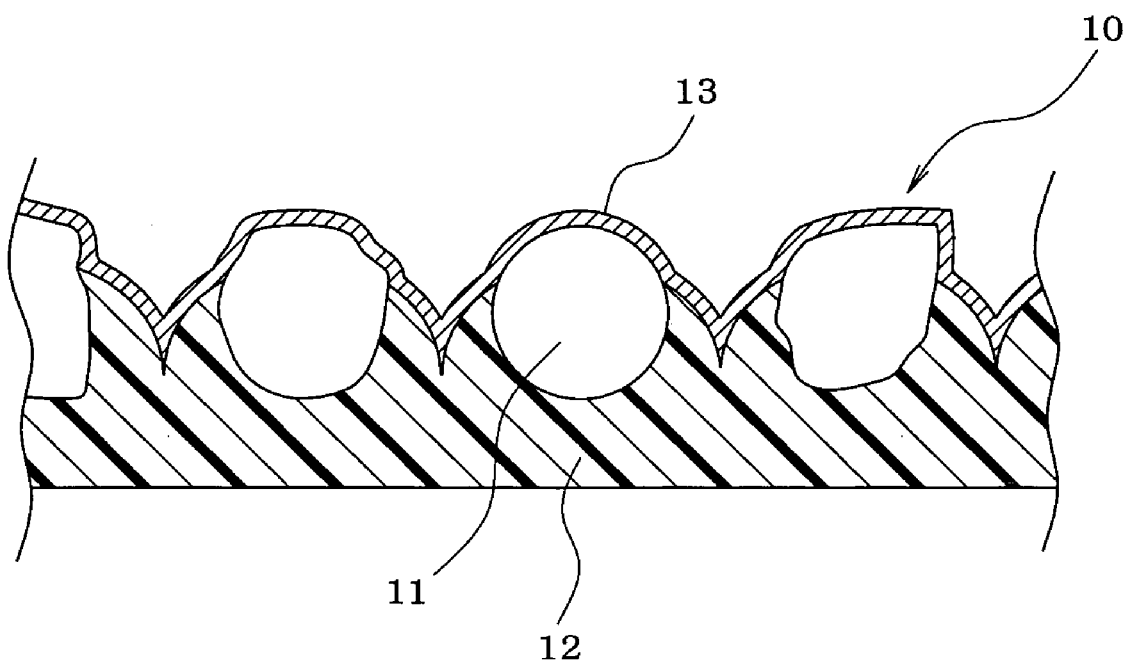
FIG. 8 shows a process of forming an n-type electrode in the fabricating method.

8. Negative Electrode Forming Process:

The fabrication sequence advances to a negative electrode forming process after completion of the parting process. As shown in FIG. 8, a negative electrode 13 is formed on the entire backside of the photovoltaic panel 10 by a conductor film forming technique such as vapor deposition, electroplating, application, CVD, sputtering or the like. A conductor composing the negative electrode 13 may be a conductor which has a small electrical resistance value, such as Ag, Ag conductor or the like and can easily reflect light (to function as a reflecting surface for incident light). The negative electrode 13 conducts to an n-type semiconductor layer located in an outer periphery of each photovoltaic device 11 and covers the backside of the transparent resin 12 thereby to serve as a reflecting surface of the incident light.

Figure 9:
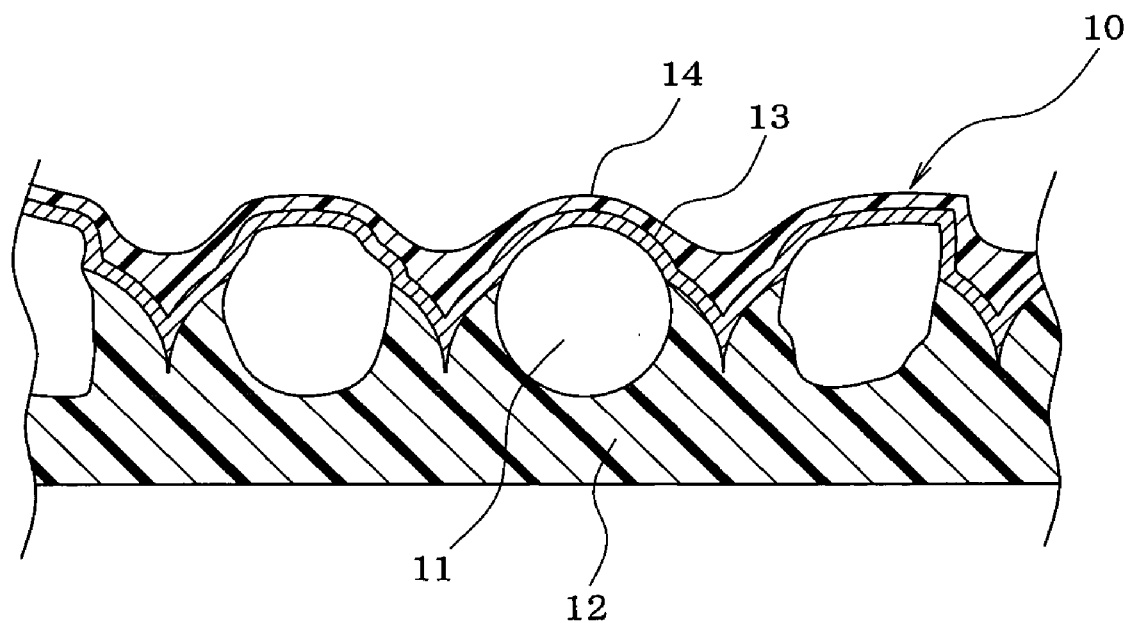
FIG. 9 shows a process of forming a protective layer in the fabricating method.

9. Protecting Layer (Lower Insulating Resin Layer) Forming Process:

The fabrication sequence advances to protecting layer forming process after completion of the negative electrode forming process. As shown in FIG. 9, an insulating resin such as an epoxy resin is applied to the entire negative electrode 13 on the backside of the photovoltaic panel 10 and hardened thereby to be formed into a protecting layer 14 (lower insulating resin layer). Thus, the entire negative electrode 13 is covered by the protecting layer 14. A resin formed into the protecting layer 14 may be a thermosetting resin, UV curable resin, anaerobic curing resin or the like but needs to have suitable insulation and resistance to etching (to be used as a mask in the etching).

Figure 10:
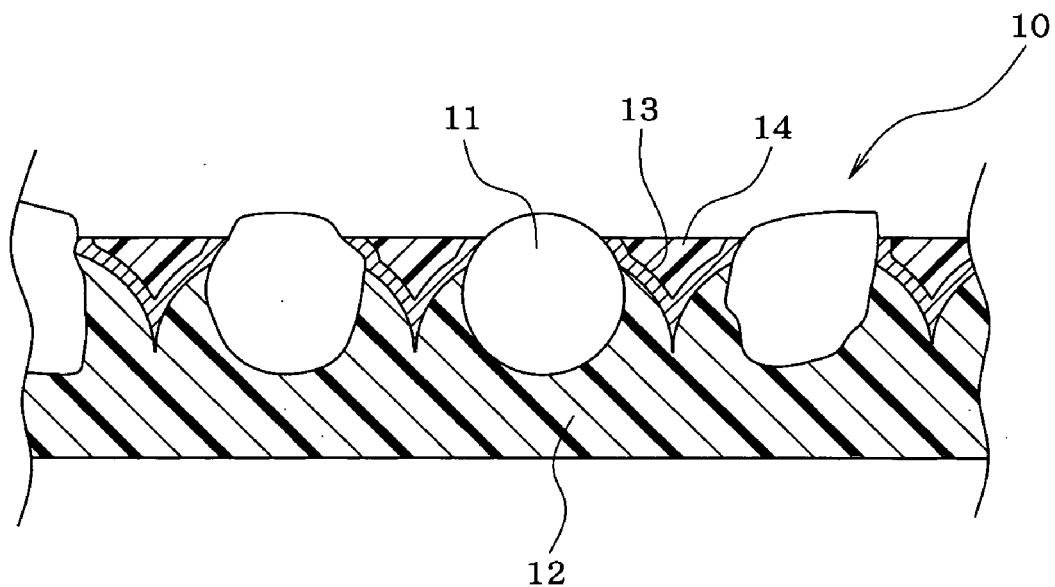
FIG. 10 shows a sandblasting process in the fabricating method.

10. Sandblasting Process:

The fabrication sequence advances to a sandblasting process after completion of the protecting layer forming process. As shown in FIG. 10, the negative electrode 13 and protecting layer 14 located in the rear end of each photovoltaic device 11 are partially removed by sandblasting, whereupon the n-type semiconductor layer on the rear end of each photovoltaic device 11 is exposed. Abrasion, laser processing, electrical discharge machining or the like may be employed to remove parts of the protecting layer 14 and the negative electrode 13, instead of sandblasting.

11. Etching Process:

After completion of the sandblasting process, the fabrication sequence advances to an etching process to remove the n-type semiconductor on the rear end of the photovoltaic device 11 exposed from the protecting layer 14 using the protecting layer 14 as a mask (etching resist) by chemical etching. As a result, the inside p-type semiconductor layer is exposed. Dry etching may be employed instead of chemical etching.

Figure 11:
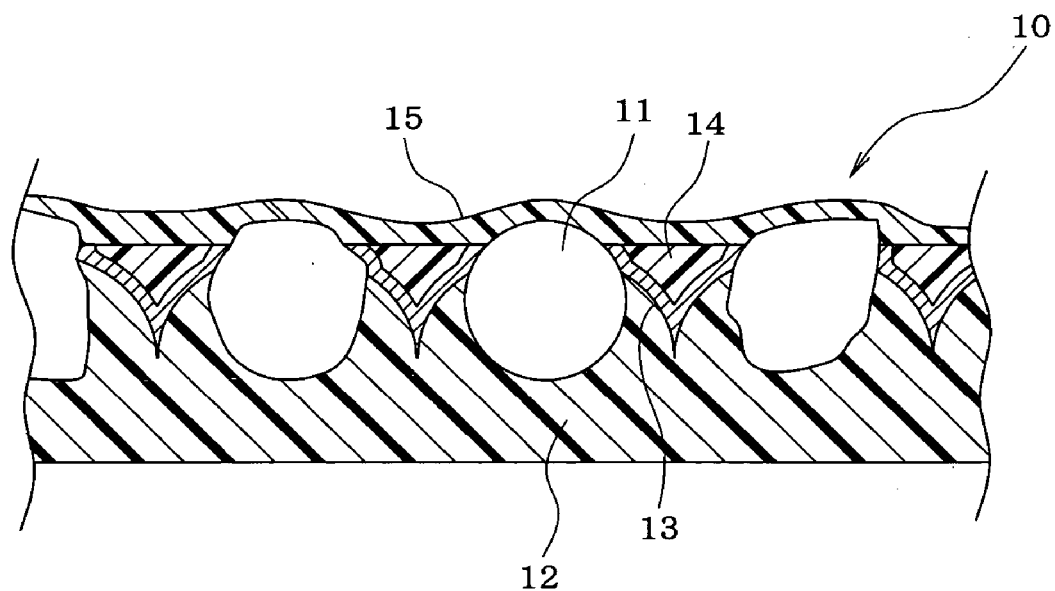
FIG. 11 shows a process of forming an insulating layer (an upper insulating resin layer) in the fabricating method.

12. Insulating Layer (Upper Insulating Resin Layer) Forming Process:

After completion of the etching process, the fabrication sequence advances to an insulating layer (upper insulating resin layer) forming process. As shown in FIG. 11, an insulating resin such as epoxy resin is applied to the entire backside of the photovoltaic panel 10 and hardened thereby to be formed into an insulating layer 15 (upper insulating resin layer). As a result, the negative electrode 13 which has partially been exposed in the sandblasting process is completely covered with the insulating layer 15. The resin formed into the insulating layer 15 may be the same as or different from the lower protecting layer 14 and may be a thermosetting resin, UV curable resin, anaerobic curing resin or the like.

Figure 12:
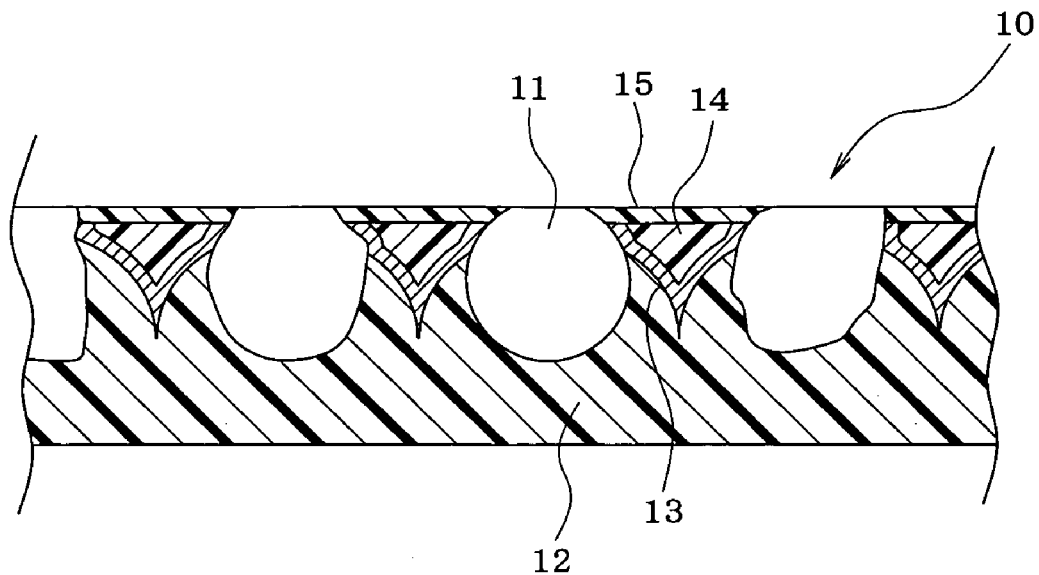
FIG. 12 shows a polishing process in the fabricating method.

13. Polishing Process:

After completion of the insulating layer forming process, the fabrication sequence advances to a polishing process. As shown in FIG. 12, the insulating layer 15 of the backside of the photovoltaic panel 10 is polished by a polishing machine and flattened. Further, the p-type semiconductor layer of the rear end of each photovoltaic device 11 is exposed from the insulating layer 15, and an exposed face of the p-type semiconductor layer is flattened. Alternatively, the insulating layer 15 may be polished by the sandblast.

14. Positive Electrode Forming Process:

After completion of the polishing process, the fabrication sequence advances to a positive electrode forming process. As shown in FIG. 13, a positive electrode 16 is formed on the entire backside of the photovoltaic panel 10 so as to adhere closely to the exposed face of the p-type semiconductor layer of each photovoltaic device 11. A conductor composing the positive electrode 16 may be the same as or different from the conductor composing the negative electrode 13. A method of forming the positive electrode 16 may be the same as or different from the method of forming the negative electrode 13. For example, a conductor such as Al may be rubbed against the entire backside of the photovoltaic panel 10 so that a frictional force and frictional heat cause the conductor to adhere to the exposed face of the p-type semiconductor layer and insulating layer 15, so that the positive electrode 16 is formed.

15. Laser Sintering Process:

After completion of the positive electrode forming process, the fabrication sequence advances to a laser sintering process, in which process laser beams are spot-irradiated onto a central junction of the positive electrode 16 and the p-type semiconductor layer of the rear end of each photovoltaic device 11. As a result, the central junction is spot-heated so that the positive electrode 16 is heat-treated (sintered) so as to be formed into an ohmic contact.

16. Protective Insulating Layer Forming Process:

After completion of the laser sintering process, the fabrication sequence advances to a protective insulating layer forming process. As shown in FIG. 14, an insulating resin is applied to the entire positive electrode 16 of the backside of the photovoltaic panel 10 and hardened to be formed into a protective insulating layer 17, which covers the entire positive electrode 16. The resin formed into the protective insulating layer 17 maybe a thermosetting resin, UV curable resin, anaerobic curing resin or the like. Fabrication of the photovoltaic panel 10 is completed when the foregoing processes 1 to 16 have been carried out thoroughly.

According to the foregoing embodiment, the escape recess 21 of the receiver 22 is filled with the plastic sealing material 23, and the forming die 24 is set on the receiver 22. The photovoltaic devices 11 accommodated in the respective bowl-shaped recesses 26 of the forming die 24 are pressed from above so that the lower portions of the photovoltaic devices 11 are fitted into the through holes 27 of the bowl-shaped recesses 26 thereby to be thrust inside the plastic sealing material 23 substantially by a predetermined amount, respectively. Thereafter, the liquid phase of the transparent resin 12 is poured into the forming cavity 25 of the forming die 24, and the liquid resin is hardened in the forming die 24 so that the photovoltaic devices 11 are integrated by the transparent resin 12 into the photovoltaic panel 10. Consequently, even when the outer diameter, shape and circularity of the photovoltaic devices 11 used in the fabrication of photovoltaic panels 10 vary to some extent, an amount of protrusion of each device from the resin of the photovoltaic panel 10 can be uniformed and the plastic sealing material 23 can seal a gap between the through hole 27 of each bowl-shaped recess 26 and the photovoltaic device 11, which gap results from the variations in the outer diameter, shape and circularity of the photovoltaic devices 11, whereupon the resin can be prevented from leaking through the gap. In this case, the viscosity of the resin may be adjusted so that the leak may be prevented more reliably. Thus, allowable ranges of the outer diameter, shape and circularity of the photovoltaic devices 11 can be expanded while the required quality level of the photovoltaic panel 10 can be met. Furthermore, the production efficiency and yield can be improved without reduction in the production quality.

Moreover, in the device thrusting process, the lower end of each photovoltaic device 11 is thrust so as to be adjacent to the bottom of the escape recess 21 of the receiver 22. Consequently, an amount of protrusion of each device from the transparent resin 12 (resin portion) of the photovoltaic panel 10 can be uniformed by a simple work, whereupon the size and height of the negative electrode 13 formed on each protruding portion can be uniformed. In the present invention, however, the viscosity of the plastic sealing material may be adjusted so that the lower portion of each photovoltaic device is thrust inside the plastic sealing material substantially by a predetermined amount, respectively.

Furthermore, in the foregoing embodiment, each through hole 27 has a diameter set so that the outer periphery of each photovoltaic device 11 is adjacent to the inner peripheral edge of the through hole 27 while the lower end of each photovoltaic device 11 is adjacent to the bottom of the escape recess 21 of the receiver 22. Consequently, the gap between the through hole 27 and the photovoltaic device 11 in each bowl-shaped recess 26 can be rendered smaller, and part of the plastic sealing material 23 can be prevented from being forced into the bowl-shaped recess 26, whereupon the boundary between the photovoltaic device 11 and the transparent resin 12 can be rendered smooth. As a result, in a process of forming the negative electrode 13, which also serves as a light reflection surface, an electrode (light reflecting surface) around the boundary between each photovoltaic device 11 and transparent resin 12 can be formed on the underside of the photovoltaic panel 10 in the electrode forming process, whereupon an amount of reflected light received by each photovoltaic device 11 can be increased and accordingly, a photovoltaic efficiency can be improved.

Figure 15:
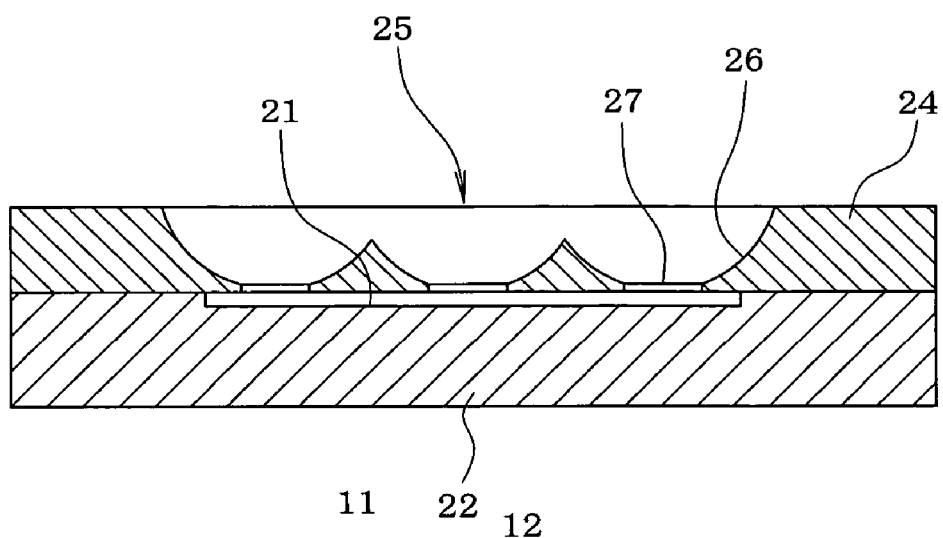
FIG. 15 shows a process of setting a forming die in the fabricating method of a second embodiment.
Figure 16:
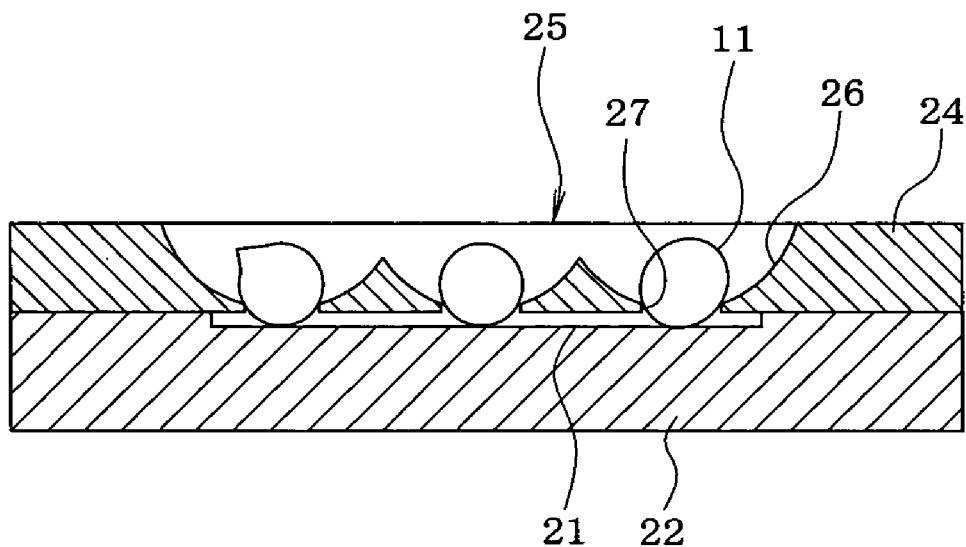
FIG. 16 shows a process of accommodating photovoltaic elements in the fabricating method of the second embodiment.

Although the escape recess 21 of the receiver 22 is filled with the plastic sealing material 23 in the above-described embodiment, the forming die 24 is set on the receiver 22 which has not been filled with the plastic sealing material 23 in a second embodiment, as shown in FIG. 15. The photovoltaic devices 11 are accommodated in the bowl-shaped recesses 26 of the forming die 24 respectively, and a lower part of each photovoltaic device 11 is fitted into the through hole 27 of each bowl-shaped recess 26 so that a lower end of each photovoltaic device 11 is adjacent to the bottom of each escape recess 21 of the receiver 22, as shown in FIG. 16. In this case, too, each through hole 27 has a diameter set so that the outer periphery of each photovoltaic device 11 is adjacent to the inner peripheral edge of the through hole 27 while the lower end of each photovoltaic device 11 is adjacent to the bottom of the escape recess 21 of the receiver 22.

Figure 17:
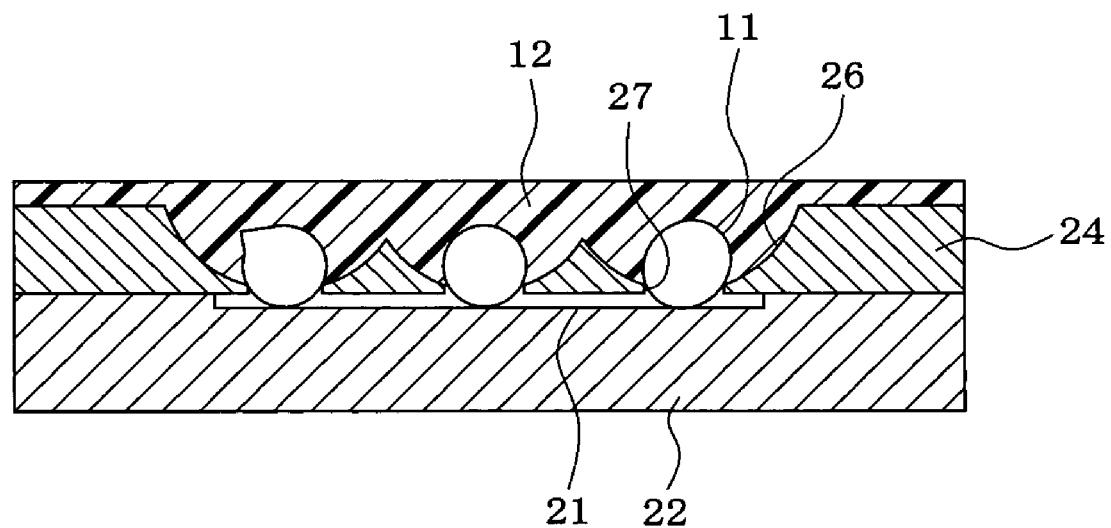
FIG. 17 shows a process of pouring a liquid resin in the fabricating method of the second embodiment.

Subsequently, a liquid phase of the transparent resin 12 poured into the forming cavity 25 of the forming die 24 and hardened to be formed into the photovoltaic panel 10, as shown in FIG. 17. In this case, the transparent resin 12 may be a UV curable resin having such a viscosity (nonfluidity) that the resin is prevented from leaking through a gap between the through hole 27 of each bowl-shaped recess 26 and the photovoltaic device 11.

After the formed photovoltaic panel 10 has been taken out of the forming die 24, the aforesaid processes from the negative electrode forming process to the protective insulating layer forming process are carried out sequentially.

In the above-described second embodiment, too, even when the outer diameter, shape and circularity of the photovoltaic devices 11 used in the fabrication of photovoltaic panels 10 vary to some extent, an amount of protrusion of each device from the resin of the photovoltaic panel 10 can be uniformed by a simple work, and the size and height of the negative electrode 13 formed on the protruding portion can be uniformed. Moreover, allowable ranges of the outer diameter, shape and circularity of the photovoltaic devices 11 can be expanded while the required quality level of the photovoltaic panel 10 can be met. Furthermore, the production efficiency and yield can be improved without reduction in the production quality.

Furthermore, each through hole 27 has a diameter set so that the outer periphery of each photovoltaic device 11 is adjacent to the inner peripheral edge of the through hole 27 while the lower end of each photovoltaic device 11 is adjacent to the bottom of the escape recess 21 of the receiver 22. Consequently, the gap between the through hole 27 and the photovoltaic device 11 in each bowl-shaped recess 26 can be rendered smaller when the liquid resin is poured into the forming cavity 25 of the forming die 24, and the liquid resin can be prevented from leaking through the gap more effectively.

The forming die 24 is used for forming the transparent resin 12 (resin section) of the photovoltaic panel 10 in the foregoing embodiments. In a third embodiment as shown in FIGS. 18 to 25, however, a forming cavity 34 is formed in a plastic sealing material 33 filling a recess 32 of a receiver 31. The forming cavity 34 thus formed is used as the forming die.

Figure 18:
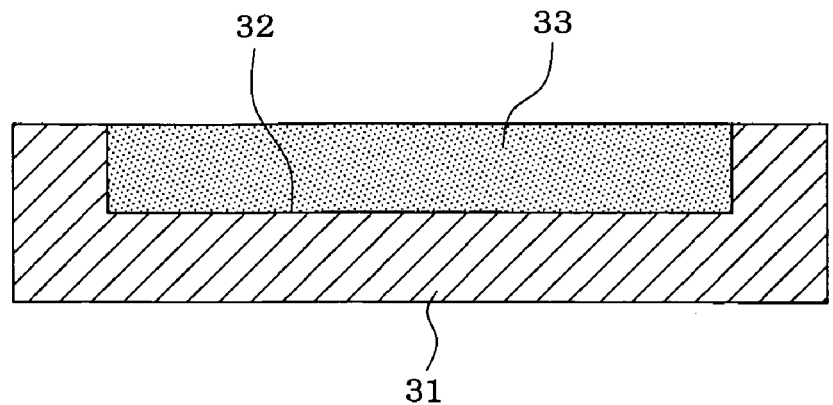
FIG. 18 shows a process of filling an escape recess with a plastic sealing material in the fabricating method of a third embodiment.
Figure 19:
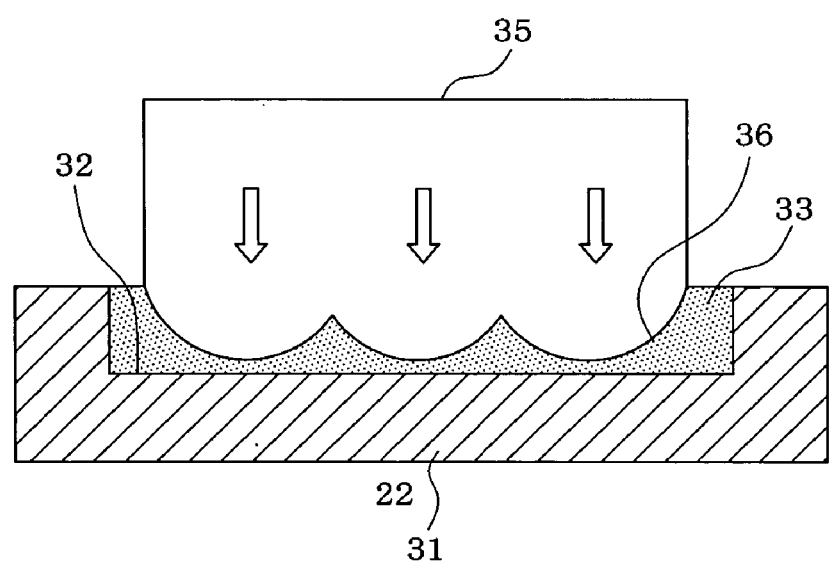
FIG. 19 shows a process of transferring a cavity shape in the fabricating method of the third embodiment (phase 1)
Figure 20:
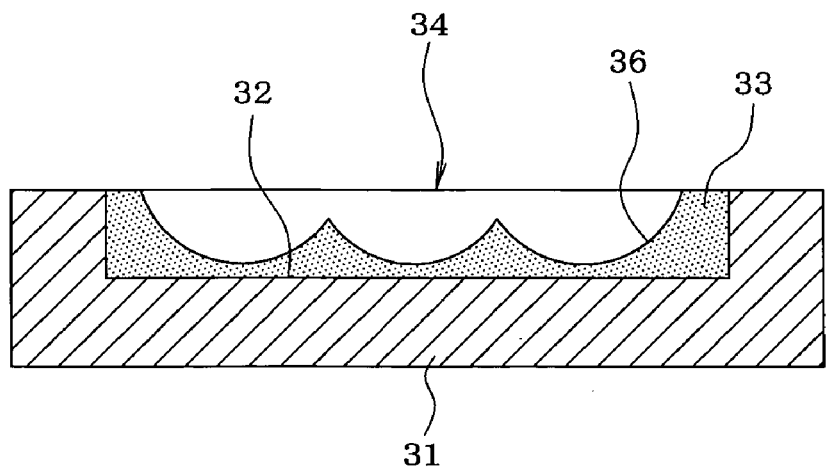
FIG. 20 shows a process of transferring a cavity shape in the fabricating method of the third embodiment (phase 2)

More specifically, the recesses 32 formed in an upper side of the receiver 31 are filled with the plastic sealing material 33, as shown in FIG. 18. Subsequently, as shown in FIG. 19, a transfer die 35 is pressed against the plastic sealing material 33. The transfer die 35 is provided for transferring a shape of a forming cavity 34 for forming the transparent resin 12 of the photovoltaic panel 10. As a result, the forming cavity 34 is formed in the plastic sealing material 33. The forming cavity 34 has a number of bowl-shaped recesses 36 in which a number of photovoltaic devices 11 are to be accommodated respectively (see FIG. 20).

Figure 21:
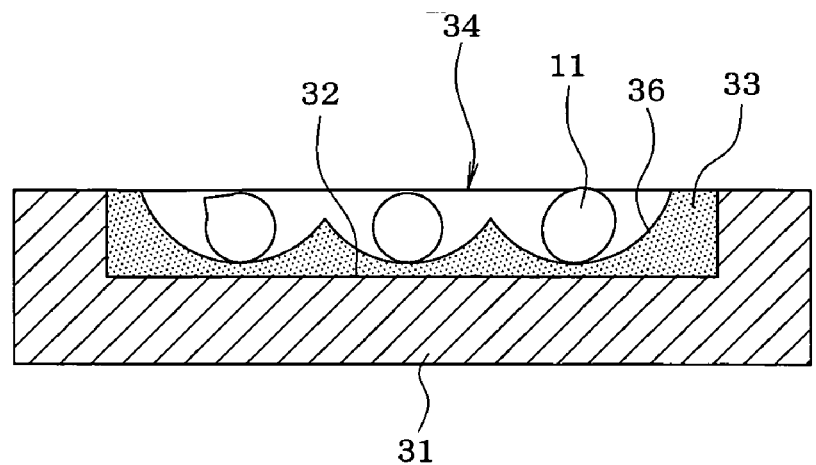
FIG. 21 shows a process of accommodating photovoltaic elements in the fabricating method of the third embodiment.
Figure 22:
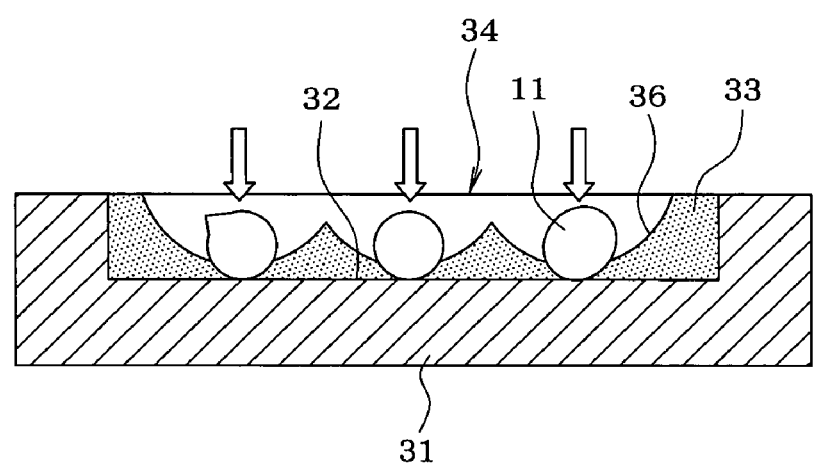
FIG. 22 shows a process of thrusting devices in the fabricating method of the third embodiment.

Subsequently, as shown in FIG. 21, the photovoltaic devices 11 are accommodated in the bowl-shaped recesses 36 of the forming cavity 34 respectively. Thereafter, as shown in FIG. 22, the photovoltaic devices 11 accommodated in the bow-shaped recesses 36 are pressed from above so that lower portions of the photovoltaic devices 11 are thrust inside the plastic sealing material 33 substantially by a predetermined amount, respectively. In this case, too, the lower end of each photovoltaic device 11 is thrust so as to be adjacent to the bottom of the recess 32 of the receiver 31, whereby the lower portion of each photovoltaic device 11 is thrust inside the plastic sealing material 33 substantially by a constant amount.

Figure 23:
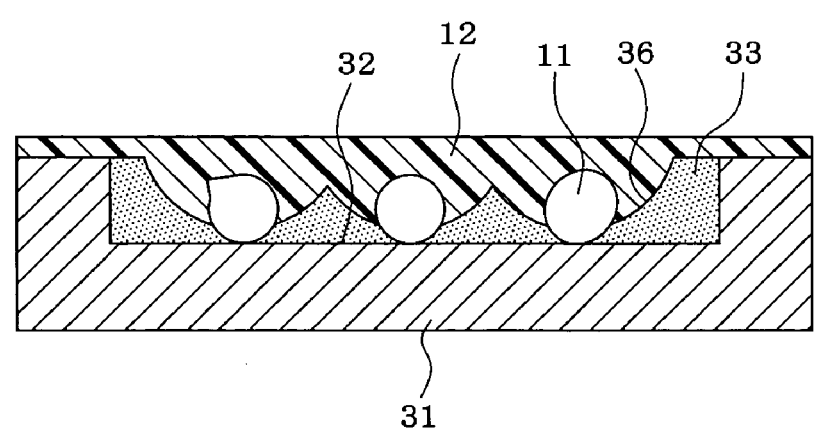
FIG. 23 shows a process of pouring a liquid resin in the fabricating method of the third embodiment.
Figure 24:
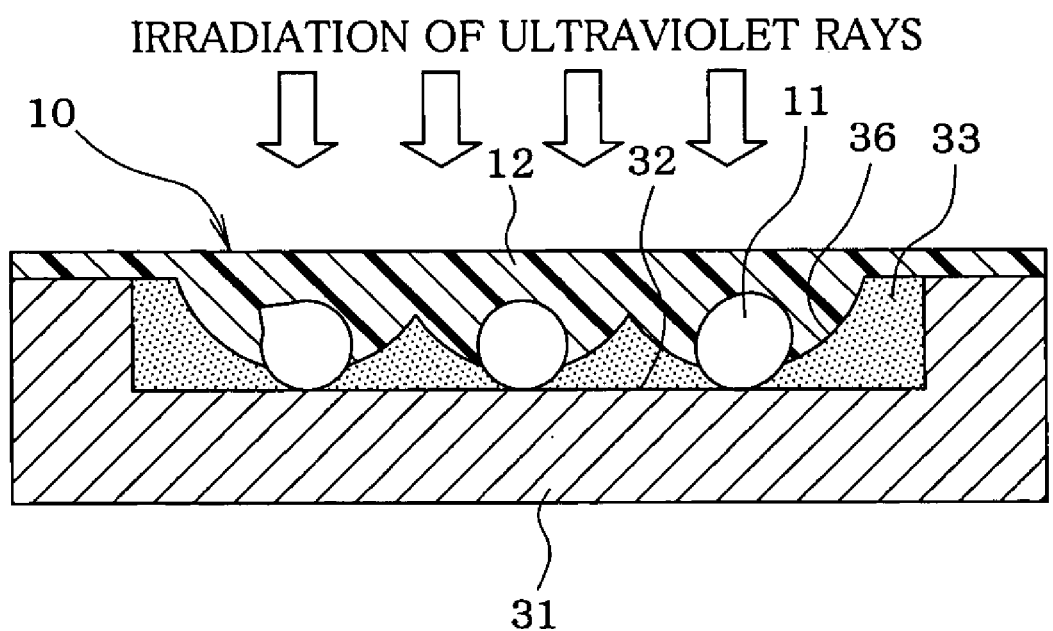
FIG. 24 shows a process of hardening the resin in the fabricating method of the third embodiment.
Figure 25:
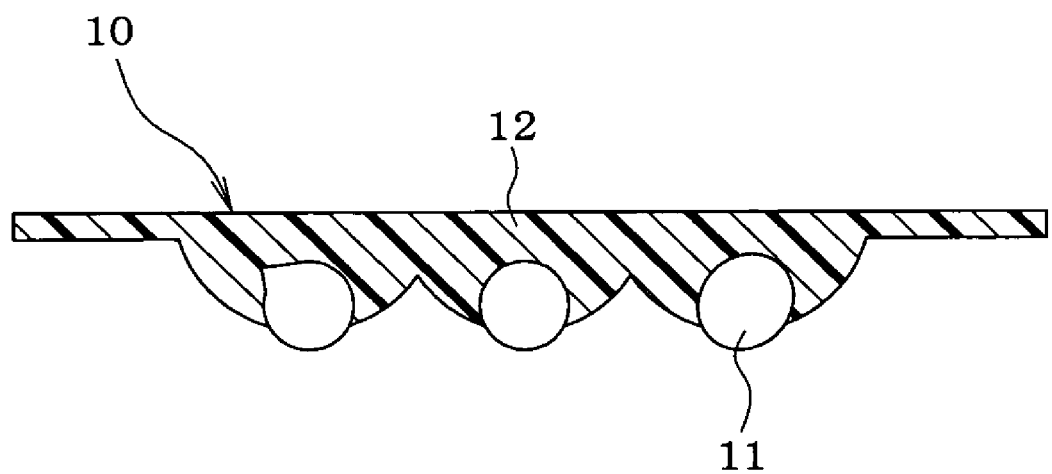
FIG. 25 shows a parting process in the third embodiment.

Subsequently, as shown in FIG. 23, the liquid resin of the transparent resin 12 (UV curable resin) is poured into the forming cavity 34 so that the entire bowl-shaped recesses 36 are sunk in the liquid resin. Thereafter, as shown in FIG. 24, ultraviolet rays are irradiated onto the liquid resin of the transparent resin 12 (UV curable resin) so that the liquid resin is hardened. Consequently, the photovoltaic panel 10 is formed by integrating the photovoltaic devices 11 by the transparent resin 12 into the panel shape and thereafter, as shown in FIG. 25, the photovoltaic panel 10 is taken out of the forming cavity 34. Thereafter, the aforesaid processes from the negative electrode forming process to the protective insulating layer forming process are carried out sequentially as in the first embodiment.

In the above-described third embodiment, the transfer die 35 is pressed against the plastic sealing material 33 filling the recess 32 of the receiver 31, whereby the forming cavity 34 is formed. The photovoltaic devices 11 accommodated in the bowl-shaped recesses 36 of the forming cavity 34 respectively are pressed from above so that the lower portions of the photovoltaic device 11 are thrust inside the plastic sealing material 33 by the predetermined amount. Thereafter, the liquid resin of transparent resin 12 (UV curable resin) is poured into the forming cavity 34 so that the photovoltaic panel 10 is formed. Consequently, even when the outer diameter, shape and circularity of the photovoltaic devices 11 used in the fabrication of photovoltaic panels 10 vary to some extent, an amount of protrusion of each device from the resin of the photovoltaic panel 10 can be uniformed, and the size and height of the negative electrode 13 formed on each protruding portion can be uniformed. Moreover, since the boundary between each photovoltaic device 11 and the transparent resin 12 is formed to be smooth, the negative electrode 13 also serving as a light reflection surface can be formed to be smooth in the negative electrode forming process. Furthermore, an amount of reflected light received by each photovoltaic device 11 can be increased and accordingly, a photovoltaic efficiency can be improved.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by be appended claims.

What is claimed is:

1. A method of fabricating a photovoltaic panel which is formed by arranging a number of granular photovoltaic devices in an array and forming the array into the shape of a panel from a transparent resin and includes each photovoltaic device having a part protruding from the resin, the method employing a forming die having a forming cavity in which a number of bowl-shaped recesses are formed so that the photovoltaic devices are accommodated in the recesses respectively, each bowl-shaped recess having a bottom formed with a circular through hole through which the part of each photovoltaic device protrudes downward, the method further employing a receiver including a part which is opposed at least to the through hole and is formed with an escape recess, the method comprising:

filling the escape recess of the receiver with a plastic sealing material;

setting the forming die on the receiver;

accommodating the photovoltaic devices in the bowl-shaped recesses of the forming die respectively;

pressing the photovoltaic devices accommodated in the bowl-shaped recesses from above so that lower portions of the photovoltaic devices are fitted into the through holes of the bowl-shaped recesses thereby to be thrust inside the plastic sealing material substantially by a predetermined amount, respectively;

pouring a liquid phase of the transparent resin into the forming cavity of the forming die;

hardening the liquid resin in the forming cavity of the forming die so that the photovoltaic devices are integrated by the transparent resin into a photovoltaic panel; and taking the photovoltaic panel out of the forming cavity of the forming die.

2. The method according to claim 1, wherein each photovoltaic device has a lower end and in the device thrusting process, the lower end of each photovoltaic device is thrust so as to be adjacent to the bottom of the escape recess of the receiver, whereby the lower portion of each photovoltaic device is thrust inside the plastic sealing material substantially by a constant amount.

3. The method according to claim 1, wherein each photovoltaic device has an outer periphery and each through hole has an inner peripheral edge, and each through hole has a diameter set so that the outer periphery of each photovoltaic device is adjacent to the inner peripheral edge of the through hole while the lower end of each photovoltaic device is adjacent to the bottom of the escape recess of the receiver.

4. The method according to claim 1, wherein an electrode is formed on the part of each photovoltaic device protruding from the resin.

* * * * *